(12) United States Patent
Akamine et al.

(10) Patent No.: US 10,277,258 B2
(45) Date of Patent: Apr. 30, 2019

(54) INFORMATION PROCESSING DEVICE AND HOST DEVICE

(71) Applicant: TOSHIBA MEMORY CORPORATION, Minato-ku (JP)

(72) Inventors: Takayuki Akamine, Yokohama (JP); Kenichiro Yoshii, Bunkyo (JP); Hiroshi Yao, Yokohama (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 88 days.

(21) Appl. No.: 15/460,320

(22) Filed: Mar. 16, 2017

(65) Prior Publication Data

US 2018/0076833 A1  Mar. 15, 2018

Related U.S. Application Data

(60) Provisional application No. 62/385,331, filed on Sep. 9, 2016.

(51) Int. Cl.
*G11C 29/00* (2006.01)
*H03M 13/00* (2006.01)
*G06F 3/06* (2006.01)
*H03M 13/25* (2006.01)
*H03M 13/15* (2006.01)
*H03M 13/29* (2006.01)
*G06F 13/24* (2006.01)
*G06F 13/22* (2006.01)

(52) U.S. Cl.
CPC ...... *H03M 13/6566* (2013.01); *G06F 3/0604* (2013.01); *G06F 3/0659* (2013.01); *G06F 3/0688* (2013.01); *G06F 13/22* (2013.01); *G06F 13/24* (2013.01); *H03M 13/152* (2013.01); *H03M 13/255* (2013.01); *H03M 13/2909* (2013.01)

(58) Field of Classification Search
None
See application file for complete search history.

(56) References Cited

U.S. PATENT DOCUMENTS 7,146,426 B2    12/2006  Hashimoto
8,484,647 B2    7/2013   Hendry et al.
2014/0129751 A1  5/2014   Cho

FOREIGN PATENT DOCUMENTS

JP    2002-271393    9/2002

*Primary Examiner* — Guerrier Merant
(74) *Attorney, Agent, or Firm* — Oblon, McClelland, Maier & Neustadt, L.L.P.

(57) ABSTRACT

According to one embodiment, in a case where a first command is received from a host, a storage device starts a first process. The storage device transmits a first response to the host in a case where a first condition is satisfied and transmits a second response and an interrupt signal to the host in a case where the first process is completed. The host, in a case where the first response is received, stops the polling and receives the second response based on reception of the interrupt signal.

11 Claims, 13 Drawing Sheets

INFORMATION PROCESSING DEVICE AND HOST DEVICE

CROSS-REFERENCE TO RELATED APPLICATIONS

This application is based upon and claims the benefit of priority from U.S. Provisional Application No. 62/385,331, filed on Sep. 9, 2016; the entire contents of which are incorporated herein by reference.

FIELD

Embodiments described herein relate generally to an information processing device including a storage device including a nonvolatile memory and a host device and a host device.

BACKGROUND

When a process corresponding to a command received from a host is completed, a storage device transmits a response representing the completion of the command to the host.

DETAILED DESCRIPTION

In general, according to one embodiment, an information processing device includes a storage device that includes a nonvolatile memory and a host device that is coupled with the storage device. The host device includes a first controller. The storage device includes a second controller. The first controller transmits a first command to the storage device and performs polling. The second controller starts a first process corresponding to the first command in a case where the first command is received from the host. The second controller transmits the first response to the host in a case where a first condition relating to an execution time of the first process is satisfied. The second controller transmits a second response and an interrupt signal to the host in a case where the first condition is satisfied and the first process is completed. The first controller stops the polling in a case where the first response is received from the storage device. The first controller receives the second response based on reception of the interrupt signal from the storage device.

Exemplary embodiments of an information processing device and a host device will be explained below in detail with reference to the accompanying drawings. The present invention is not limited to the following embodiments.

First Embodiment

Figure 1:
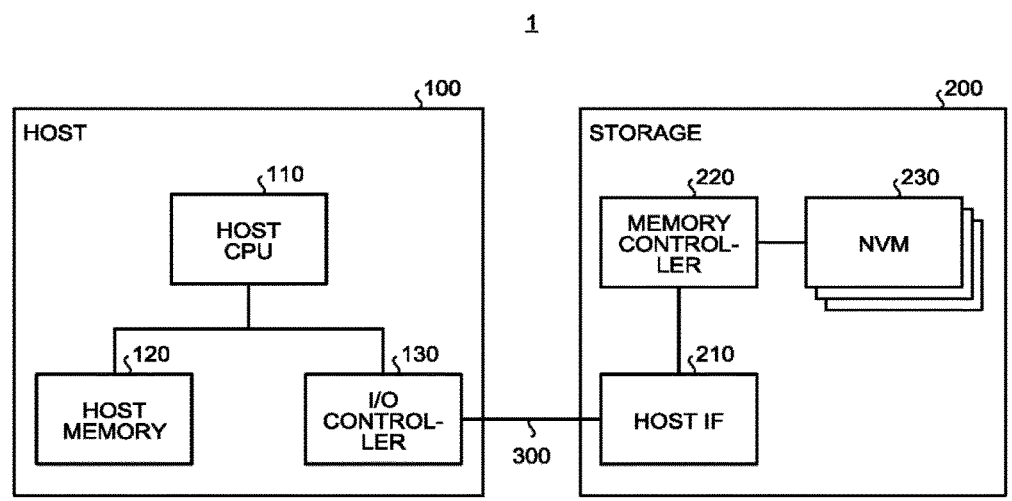
FIG. 1 is a functional block diagram that illustrates an example of the configuration of an information processing device according to a first embodiment.

FIG. 1 is a functional block diagram that illustrates an example of the configuration of an information processing device 1 according to a first embodiment. The information processing device 1 includes: a host device (hereinafter, abbreviated to a host) 100; a storage device (hereinafter, abbreviated to a storage) 200 as a memory system; and an I/O bus 300 as a communication line connecting the host 100 and the storage 200. The information processing device 1, for example, is a personal computer, a cellular phone, an imaging device, a mobile terminal such as a tablet computer or a smartphone, a gaming device, or an in-vehicle terminal such as a car navigation system.

The host 100 includes a host CPU 110, a host memory 120, and an I/O controller 130. The host CPU 110 performs calculation and various processes based on an instruction supplied from a task operating on the host 100. The host CPU 110 corresponds to a first controller in claims. The host memory 120 is a memory in which data to be accessed by the host CPU 110 is stored. The host memory 120 is configured by a volatile memory such as a dynamic random access memory (DRAM) or a static random access memory (SRAM). Write data to be written into the storage 200 and read data read from the storage 200 are stored in the host memory 120. In addition, a response received from the storage 200 is stored in the hot memory 120.

The I/O controller 130 communicates with the storage 200 through the I/O bus 300. More specifically, the I/O controller 130 converts data transmitted from the host 100 to the storage 200 into packets and transmits the packets to the storage 200. In response to a request from the host CPU 0.110, the I/O controller 130 reads data from the host memory 120 and transmits the read data to the storage 200. In addition, the I/O controller 130 transmits data received from the storage 200 to the host CPU 110 or the host memory 120. The I/O controller 130 has the function of a DMA controller transmitting data between the storage 200 and the host memory 120 by direct memory access (DMA) transfer. The I/O controller 130 transmits data transmitted from the storage 200 to an internal functional unit such as the host memory 120 in response to a request from the host CPU 110. When an interrupt signal is received from the storage 200 through the I/O bus 300, the I/O controller 130 notifies the interrupt signal to the host CPU 110.

The storage 200 includes a host IF 210, a memory controller 220, and a nonvolatile memory (hereinafter, abbreviated to an NVM) 230. The memory controller 220 corresponds to a second controller in claims. The host IF 210 transmits a packet received from the I/O bus 300 to the memory controller 220 or transmits data received from the memory controller 220 to the host 100. The memory controller 220 analyzes a command received through the host IF 210 and accesses the NVM 230 or performs a process corresponding to the command. The NVM 230 is a nonvolatile memory and, for example, is a storage class memory (SCM). The NVM 230, for example, is a cross-point memory, a phase change memory (PCM), a magnetoresistive random access memory (MRAM), a resistance random access memory (ReRAM), or a ferroelectric random access memory (FeRAM). The NVM 230 includes a memory that realizes non-volatility by combining a volatile memory such as an SRAM or a DRAM and a battery. As the NVM 230, a two-dimensional or three-dimensional NAND flash memory may be used. The NVM 230 includes one or a plurality of memory chips each including a memory cell array in which a plurality of memory cells are arranged in an array pattern. Each memory cell can perform binary recording or multi-value recording. One memory chip, for example, includes a plurality of blocks. For example, the location of a memory cell can be designated using a physical address including a chip address, a block address, a word-line address, and the like.

Figure 2:
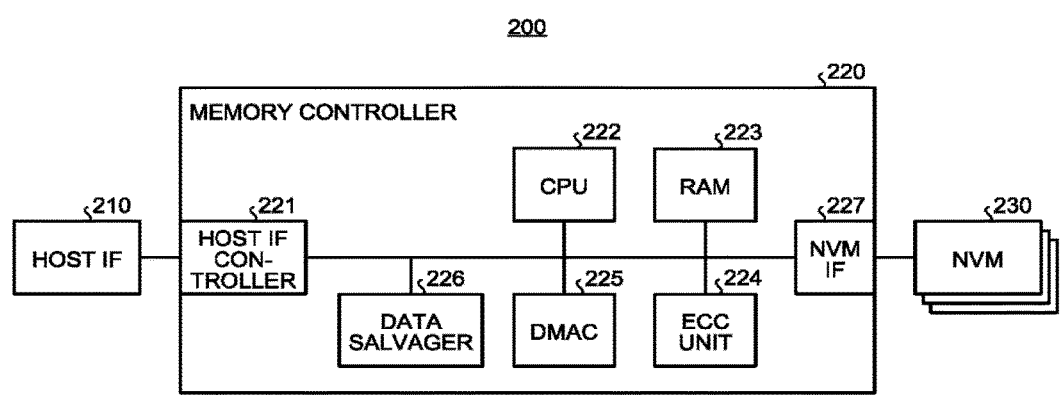
FIG. 2 is a functional block diagram that illustrates an example of the configuration of a storage device.

FIG. 2 illustrates the internal structure of the memory controller 220. The function of the memory controller 220 is realized by one or a plurality of CPUs (processors) executing firmware loaded into the RAM 223 and peripheral circuits. The memory controller 220 includes a host IF controller 221, a CPU 222, a RAM 223, an ECC unit 224, a DMAC 225, a data salvager 226, and a NVM IF 227.

The host IF controller 221 transmits a command input from the host IF 210 to the CPU 222 and transmits data input from each functional unit disposed inside the memory controller 220 to various functional units of the host 100 through the host IF 210. The CPU 222 integrally controls each functional unit disposed inside the memory controller 220. The CPU 222 performs processes such as a logical/physical translation process translating a logical address received from the host 100 into a real address (physical address) of the NVM 230, wear leveling, and the like.

The RAM 223 is a volatile memory used for buffering data. The firmware executed by the CPU 222 is also loaded into the RAM 223. Data received from the host 100 is temporarily stored in the RAM 223 before being written into the NVM 230. Data read from the NVM 230 is temporarily stored in the RAM 223 before being transmitted to the host 100.

The error correcting code (ECC) unit 224 performs an error correction coding process for data written into the NVM 230, thereby generating parity. The ECC unit 224 outputs a code word including data and parity to the NVM IF 227. The ECC unit 224 performs an error correction decoding process using a code word read from the NVM 230 and transmits decoded data to the RAM 223. The ECC unit 224 has an upper limit of error correction and fails in error correction in a case where a bit error exceeding the upper limit occurs.

The DMAC 225, in accordance with a command from the CPU 222, performs data transmission between functional units disposed inside the memory controller 220 and performs data transmission between the functional units disposed inside the memory controller 220 and functional units of the host memory 120 of the host 100 and the like.

The data salvager 226 has a function for restoring data that cannot be corrected by the ECC unit 224. The data salvager 226, for example, has error correction capability higher than the error correction capability of the ECC unit 224. The error correction capability, for example, is changed by changing the size of data configuring a code word and/or a coding system. In the ECC unit 224, for example, a BCH (Bose Chaudhuri Hocquenghem) code is employed as a coding system. In the data salvager 226, for example, a product code or a low-density parity-check code (LDPC) is employed as a cording system.

In addition, the data salvager 226 may have a function for calculating a read voltage for re-reading and re-reading data using the calculated re-read voltage. For example, in a case where the ECC unit 224 fails in an error correction process, the data salvager 226 calculates a read voltage for re-reading and re-reads data using the calculated read voltage. A decoding process is performed for the re-read data by the ECC unit 224.

In order to calculate the read voltage for re-reading, while an arbitrary technique may be employed, a technique called Vth tracking may be used. The Vth tracking can be applied in a case where the NVM 230 is configured by a multi-value memory having a distribution of $2^n$ threshold voltages (here, n is a natural number of two or more) like a flash memory. In the Vth tracking, while a plurality of kinds of read voltages are sequentially applied to a selected word line, threshold voltages of a plurality of memory cells connected to the word line are determined, and results of the determinations are counted, whereby a distribution (a shape having ridges and valleys or the like) of the threshold voltages of the memory cells is acquired. Then, a minimum value of the valleys is set as an optimal read voltage.

The NVM IF 227 accesses the NVM 230 under the control of the CPU 222, thereby performing read control or write control for the NVM 230.

When a process corresponding to a read request or a write request received from the host is completed, in order to transmit a response representing the completion of the request to the host, a storage such as a solid state drive (SSD) using a flash memory uses an interrupt system. In this interrupt system, when the process is completed, the storage transmits an interrupt signal to the host. In a case of a SATA (Serial ATA) protocol, the interrupt signal corresponds to an INTRQ signal. In a case of a NVM Express protocol, the interrupt signal corresponds to MSI, MSI-X, or INTx. When receiving the interrupt signal, the host starts up an interrupt handler. Since the interrupt handler accompanies context switching, it takes a time of the order of two-digit μsec. In a case where the interrupt system is used, while the storage performs a process, the host can perform another process, whereby the use efficiency of calculation resources in the host is improved. Overhead generated according to an interrupt is negligibly smaller than a delay time required for accessing the storage.

On the other hand, in a low latency storage such as a storage class memory that can be accessed in the order of several μsec, a time required for performing an interrupt process in the host is longer than a processing time required for the storage, and accordingly, the interrupt system is not appropriate. For this reason, in the low latency storage, there is a high possibility that a completion response using a polling system is positively used. Here, polling is a process in which the host regularly checks whether or not the process of the storage is completed. In a case where the polling is used, while the storage performs a process, the host can perform another process. However, in such a case, overhead applied to the host after the completion of the process of the storage is smaller than that of the interrupt system. For the low latency storage, by using the polling system, a delay time for accessing the storage in the whole system can be shortened.

However, also in a case where the polling system is used, there is a possibility that problems as below may occur. The low latency storage is designed such that the process is completed with a constant delay time, there are cases where the delay time is increased. For example, there is a possibility that data stored in a memory cannot be read due to a certain factor. While data that cannot be read can be restored by the data salvager 226, a long time is required for the restoration process. Also in such a state, the host continuously performs polling, and accordingly, the calculation resources of the host are consumed according to long-time polling.

Thus, in this embodiment, the host, first, uses the polling system and then, switches the method of checking a completion notification from the polling system to the interrupt system in response to a request from the storage. In a case where a long time is required for the process, the storage transmits a request for switching the method of checking a completion response to the host. In this way, a decrease in the use efficiency of calculation resources in the host can be prevented. Hereinafter, a first embodiment will be described in detail.

Figure 3:
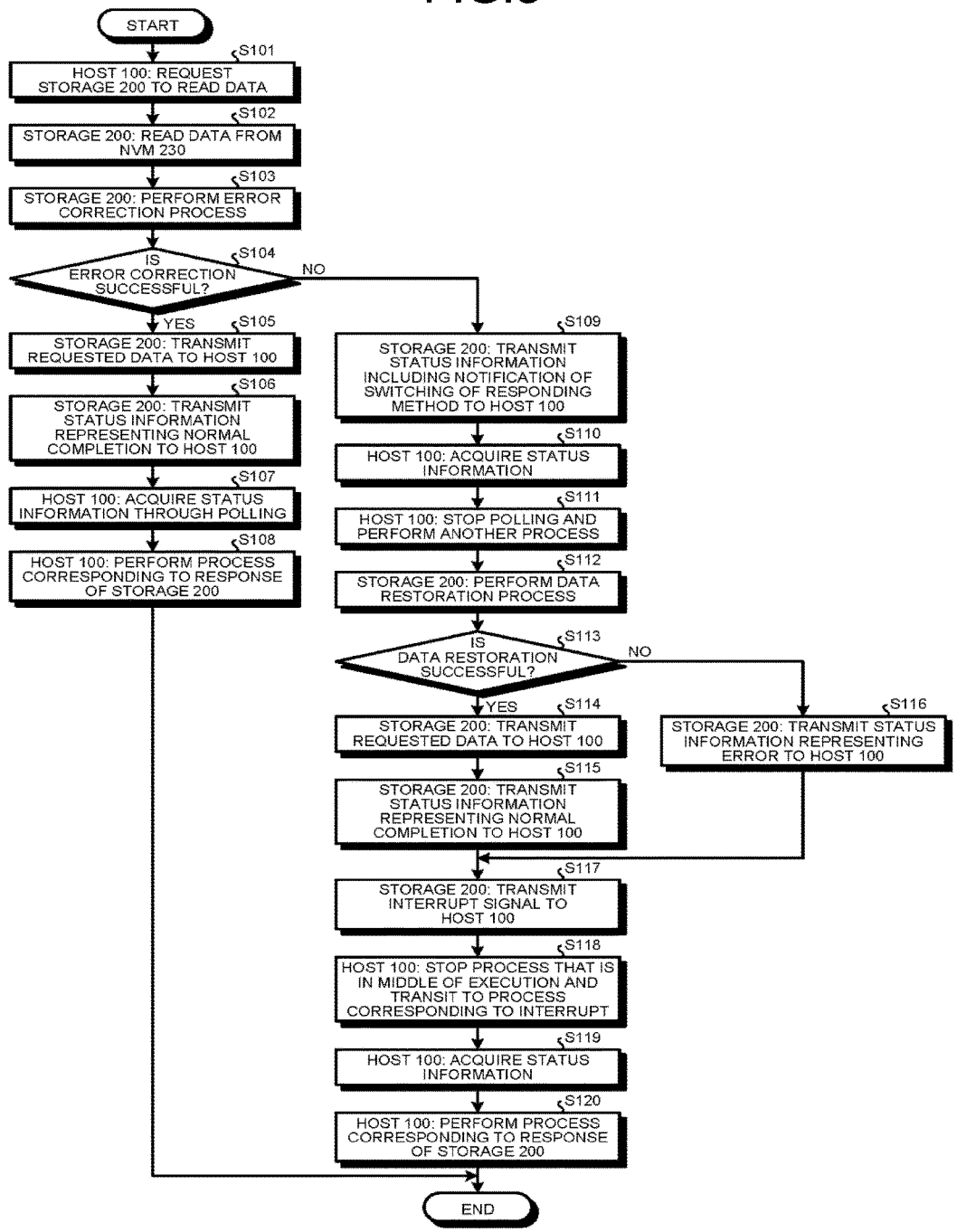
FIG. 3 is a flowchart that illustrates an example of the operation sequence of the information processing device according to the first embodiment.

FIG. 3 is a flowchart that illustrates an outline of the operations of the host 100 and the storage 200 performed when the host 100 requests the storage 200 to perform data read. A series of processes illustrated in FIG. 3 is performed when a task operating on the host 100 requests a process of reading data from the storage 200. First, the host 100 issues a read request to the storage 200 (S101). The read request, for example, includes a read command, a logical address designated by the read command, and a data length. The read request may include an address of the host memory 120 at which data read from the storage 200 is stored. After the issuance of this read request, the host 100 checks whether or not a completion response (status information representing normal completion) has been notified from the storage 200 through polling.

The storage 200 reads data designated by the read request, which has been received from the host 100, from the NVM 230 (S102). The storage 200 performs an error correction process for the data read from the NVM 230 (S103). In a case where the error correction is successful (S104: Yes), the storage 200 transmits error-corrected data to the host 100 (S105). When the data transmission is completed, the storage 200 generates status information that represents normal completion and transmits the generated status information representing the normal completion to the host 100 (S106). The host 100 acquires the status information described above through polling and analyzes the content thereof (S107). The host 100 performs a process corresponding to the completion response of the storage 200 and ends the series of sequences (S108). After the completion of the series of sequences described above, the host 100 returns the process to the process of a task.

On the other hand, in a case where the error correction process fails (S104: No), the storage 200 generates status information used for notifying switching of a responding method to the host 100 and transmits the generated status information to the host 100 (S109). The host 100 acquires this status information through polling and analyzes the content thereof (S110). Then, the host 100 stops polling (S111). Thereafter, until an interrupt signal of the storage 200 is received, the host 100 may move to the execution of another process in accordance with the internal state. For example, when a request for a process having a priority level higher than a certain level is issued, the host 100 performs the process having the higher priority level for which the request has been issued.

In a case where the error correction process fails (S104: No), the storage 200 performs a process of restoring data for which the error correction process has failed (S112). In a case where the data restoration process is successful (S113: Yes), the storage 200 transmits restored data to the host 100 (S114). After completion of the data transmission, the storage 200 generates status information representing normal completion and transmits the generated status information representing the normal completion to the host 100 (S115). On the other hand, in a case where the data restoration process fails (S113: No), the storage 200 generates status information representing an error and transmits the status information representing the generated error to the host 100 (S116).

In addition, the storage 200 transmits an interrupt signal to the host 100 (S117). When the interrupt signal is received, the host 100 stops the process that is in the middle of execution and performs an interrupt handler process corresponding to the interrupt signal (S118). The host 100 acquires status information representing normal completion or status information representing an error that is transmitted from the storage 200 by the interrupt handler process described above and analyzes the content thereof (S119). Thereafter, the host 100 performs a process corresponding to a response from the storage 200 (S120). After the completion of the series of sequences described above, the host 100 is returned from the interrupt process and is returned to the process of the task.

Figure 4:
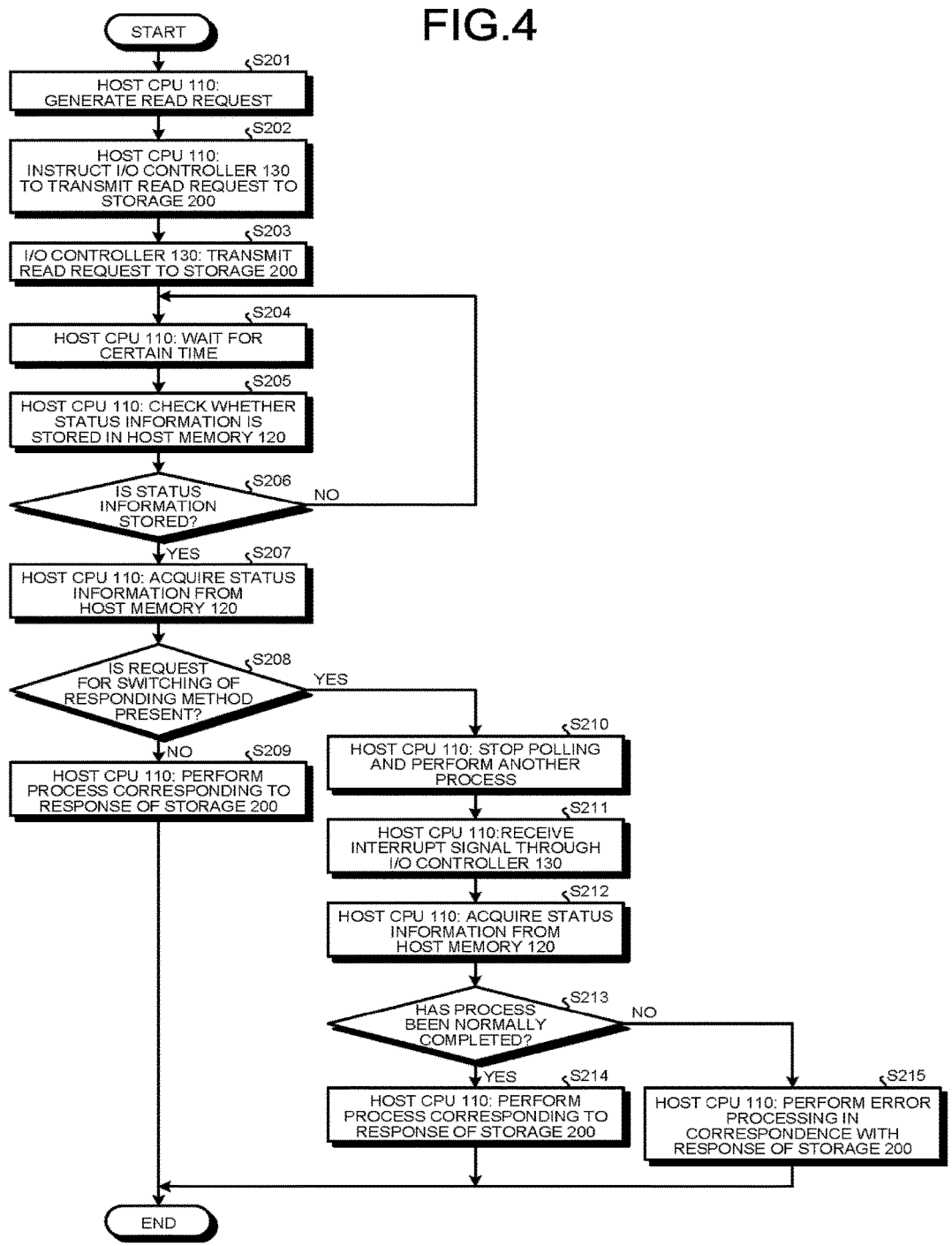
FIG. 4 is a flowchart that illustrates an example of the operation sequence of a host device according to the first embodiment.
Figure 5:
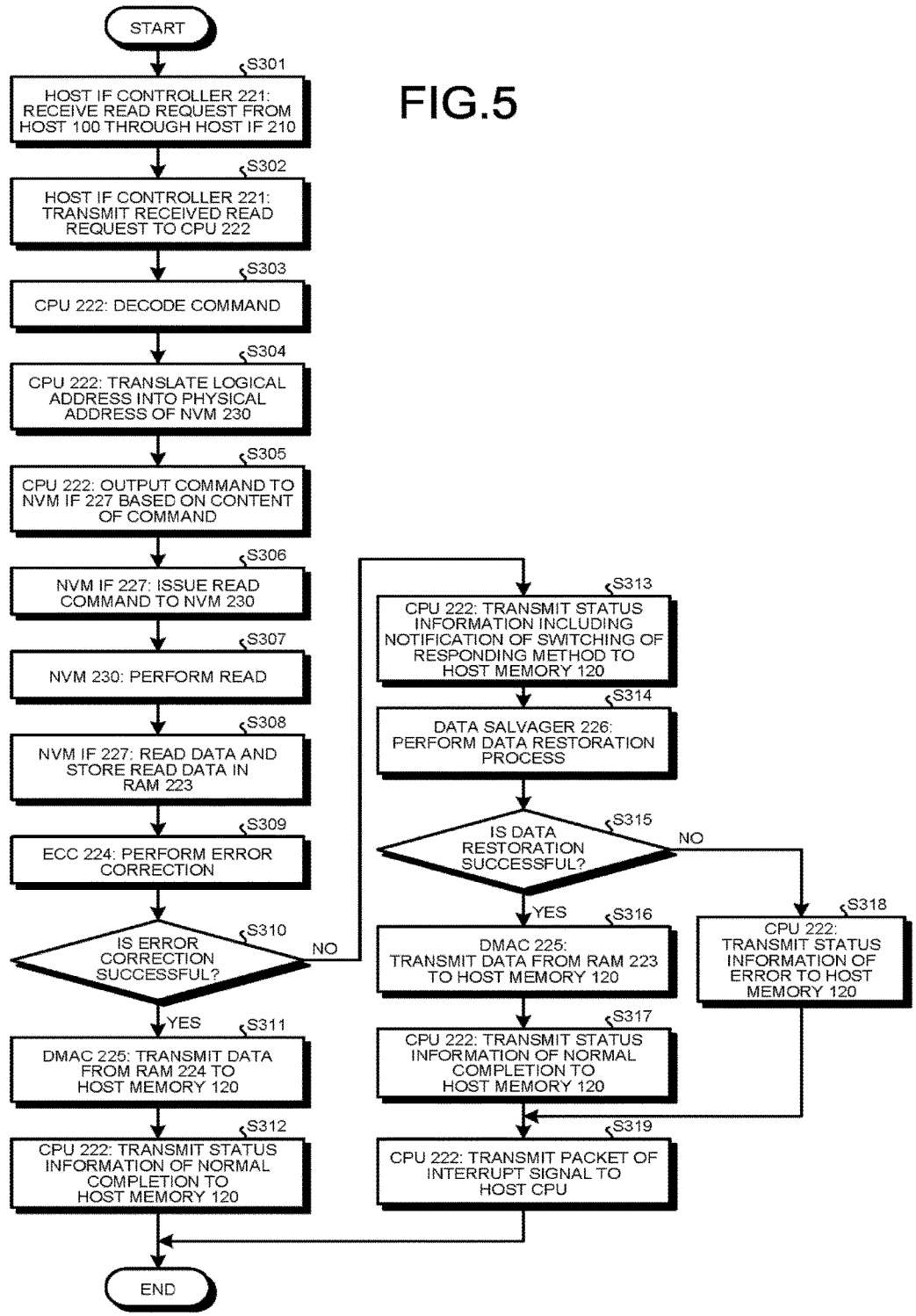
FIG. 5 is a flowchart that illustrates an example of the operation sequence of the storage device according to the first embodiment.

Next, the read process described above will be described in detail with reference to FIGS. 4 and 5. FIG. 4 is a flowchart that illustrates a detailed operation of the host 100. FIG. 5 is a flowchart that illustrates a detailed operation of the storage 200 (the memory controller 220).

First, the detailed operation of the host 100 will be described with reference to FIG. 4. When a data read request is received from a task operating on the host CPU 110, the host CPU 110 generates a read request including a read command issued to the storage 200, a logical address, and a data length (S201). The host CPU 110 performs control of the I/O controller 130 such that the generated read request is transmitted to the storage 200 (S202). The I/O controller 130 transmits the read request to the storage 200 through the I/O bus 300 (S203). Thereafter, in order to perform polling, the host CPU 110 waits for a certain time determined in advance (S204). When the certain time elapses, the host CPU 110 checks the status information stored in the host memory 120 (S205). The status information described above is issued by the storage 200. The storage 200 generates the status information described above and transmits the generated status information to the host memory 120 through the I/O bus 300 and the I/O controller 130.

In a case where the status information is not stored in the host memory 120 (S206: No), the host CPU 110, after the certain time elapses (S204), checks whether or not the status information is stored in the host memory 120 again (S205). In this way, until reception of the status information is checked, the host CPU 110 performs a polling process of repeating the process of Step S204 and S206. In S204, a waiting time of the second time or thereafter may be set to be shorter than the waiting time of the first time. In a case where the status information is stored in the host memory 120 (S206: Yes), the host CPU 110 acquires the status information from the host memory 120 and checks the content of the acquired status information (S207). The host CPU 110 determines whether or not a request for switching of the responding method is included in the status information. In a case where the request for switching of the responding method is not included (S208: No), the host CPU 110 performs a process corresponding to the response from the storage 200 (S209). In a case where the status information described above represents normal completion, since the read data transmitted from the storage 200 is stored in the host memory 120, the host CPU 110 reads the read data from the host memory 120 and performs a process using this read data. In a case where a request for switching of the responding method is included in the status information (S208: Yes), the host CPU 110 stops the polling. Thereafter, until an interrupt signal of the storage 200 is received, the host 100 performs another process in accordance with the internal state (S210).

The host CPU 110 receives the interrupt signal through the I/O controller 130 (S211). When the interrupt signal is received, the host CPU 110 starts up the interrupt handler, acquires the status information from the host memory 120, and checks the content of the acquired status information (S212). In a case where it is checked that a process corresponding to the read request is normally completed based on the status information (S213: Yes), the host CPU 110 reads read data from the host memory 120 and performs a process using this read data (S214). On the other hand, in a case where it is checked that the process corresponding to the read request is not normally completed based on the status information (S213: No), the host CPU 110 performs error processing (S215). After the process of S214 or S215 is completed, the host CPU 110 is returned from the interrupt handler and is returned to the original task.

Next, the operation of the storage 200 will be described with reference to FIG. 5. Inside the storage 200, mainly, the memory controller 220 operates as a main body. By being triggered upon reception of a read request from the host 100 in the host IF 210, the operation illustrated in FIG. 5 is started. First, the host IF controller 221 receives a read request including a read command, a logical address, and a data length from the host 100 through the host IF 210 (S301). The host IF controller 221 transmits the received read request to the CPU 222 (S302). The CPU 222 decodes the transmitted read command (S303). The decoding process described above converts a command received from the host 100 into a command format that can be interpreted by the NVM IF 227.

Next, the CPU 222 translates the logical address designated by the read command into a physical address (S304). The physical address, for example, includes a chip address, a block address, and a word line address and represents a storage position of data inside the storage 200. The CPU 222 outputs a read command corresponding to the read command to the NVM IF 227 (S305). The NVM IF 227 converts the input read command into a command that can be interpreted by the NVM 230 and outputs the converted command to the NVM 230 (S306). The NVM 230 performs a read process based on the read command (S307). The NVM 230 selects the memory block and the word line designated by the received command and performs the read process. Read data is stored in a buffer disposed inside the NVM 230. When the read process is completed, the NVM 230 notifies read completion to the NVM IF 227. When the notification of the read completion is received from the NVM 230, the NVM IF 227 takes out data from the NVM 230 and stores the taken-out data in the RAM 223 (S308).

Next, the ECC unit 224 reads data from the RAM 223 and performs an error correction for the read data (S309). The ECC unit 224 stores the error-corrected data in the RAM 223 again. In a case where the error exceeds the limit of the error correction capability of the ECC unit 224, the error correction fails. In a case where the error correction is successful (S310: Yes), the DMAC 225 reads data from the RAM 223 and transmits the read data to the host memory 120 through the host IF controller 221, the host IF 100, the I/O bus 300, and the I/O controller 130 (S311). When the transmission of the data to the host 100 is completed, the DMAC 225 notifies the completion of the transmission of the data to the CPU 222. When this notification is received, the CPU 222 generates status information representing normal completion and transmits the generated status information to the host memory 120 through the host IF controller 221 (S312). The status information transmitted to the host 100 is acquired by the host CPU 110 through a polling process in which the host CPU 110 regularly checks the host memory 120. According to the acquisition of this status information, the host CPU 110 recognizes the completion of the process requested by the host CPU 110.

On the other hand, in a case where the error correction fails (S310: No), the CPU 222 generates status information including a request for switching of the responding method and transmits the generated status information to the host memory 120 through the host IF controller 221 (S313). The status information transmitted to the host 100 is acquired by the host CPU 110 through the polling process described above. When this status information is acquired, the host CPU 110 stops the polling process. The host CPU 110 may stop the polling process and be context switched to another process. Next, the data salvager 226 reads data from the RAM 223 and performs a process of restoring the read data (S314). This data restoration process requires a long time and, for example, it takes several tens of μsec to several hundreds of μsec for the process. In addition, there is a possibility that the data cannot be restored by the data salvager 226.

In a case where the data restoration performed by the data salvager 226 is successful (S315: Yes), the DMAC 225 reads the restored data from the RAM 223 and transmits the read data to the host memory 120 through the host IF controller 221 (S316). When the transmission of the restored data is completed, the CPU 222 generates status information representing normal completion and transmits the generated status information representing the normal completion to the host memory 120 through the host IF controller 221 (S317). On the other hand, in a case where the data restoration fails (S315: No), the CPU 222 generates status information representing an error and transmits the generated status information representing the error to the host memory 120 through the host IF controller 221 (S318). In addition, the CPU 222 transmits a packet of an interrupt signal to the host CPU 110 through the host IF controller 221 (S319). In response to this interrupt signal, the host CPU 110 starts up an interrupt handler and acquires the status information from the host memory 120. The host CPU 110 performs subsequent processes based on the acquired status information. In a case where the status information representing normal completion is received, the host CPU 110 reads read data from the host memory 120 and performs a process using this read data. In a case where the status information representing an error is received, the host CPU 110 performs error processing.

In the description presented above, while the read process has been described as an example, the first embodiment can be also applied to the case of a write process. When a write request is received from the host 100, the storage 200 writes write data designated by the write command into a first area of the NVM 230. In a case where the write process for the first area is successful, the storage 200 transmits status information representing normal completion to the host 100. The host 100 checks the status information representing the normal completion through polling. On the other hand, in a case where the write process for the first area fails, the storage 200 transmits status information including a request for switching of the responding method to the host 100. The host 100 checks the status information including the request for the switching through polling and stops the polling process. In addition, the storage 200 writes the write data designated by the write command into a second area of the NVM 230 that is different from the first area. When the write process for the second area ends, the storage 200 transmits status information representing normal completion to the host 100. In addition, the storage 200 transmits an interrupt signal to the host 100. When this interrupt signal is received, the host 100 acquires the status information representing normal completion by being triggered upon the interrupt signal.

Figure 6:
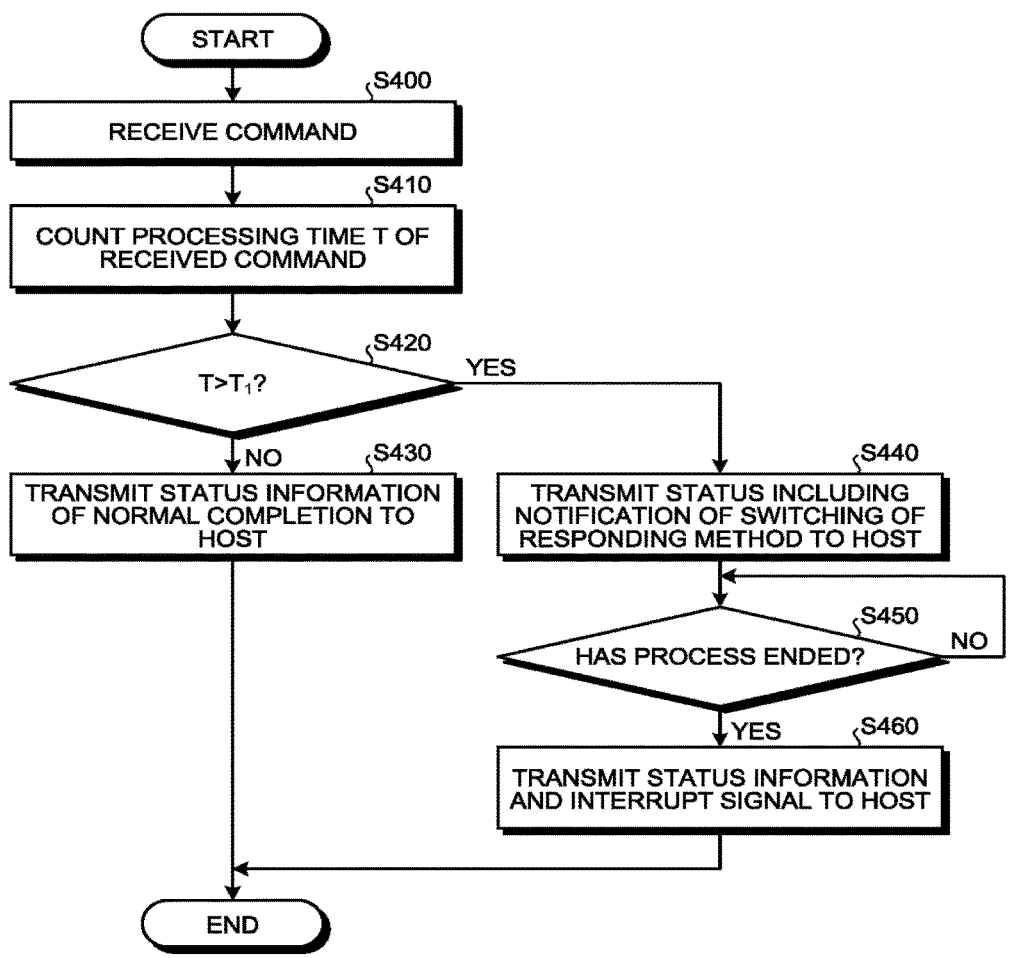
FIG. 6 is a flowchart that illustrates an example of another operation sequence of the storage device according to the first embodiment.

In addition, the storage 200 may count a time required for a process corresponding to the request from the host 100 and, when a count value T exceeds a threshold T1, transmit status information including a request for switching of the responding method to the host 100. FIG. 6 is a flowchart that illustrates such a processing sequence. When a command is received from the host 100 (S400), the memory controller 220 of the storage 200 starts counting the processing time of the command (S410). The memory controller 220 compares the count value T with the threshold T1 (S420). In a case where the process of the command ends before the count value T exceeds the threshold T1 (S420: No), the memory controller 220 transmits status information representing normal completion to the host 100 (S430). On the other hand, in a case where the process of the command has not ended when the count value T exceeds the threshold T1 (S420: Yes), the memory controller 220 transmits status information including a request for switching of the responding method to the host 100 when the count value T exceeds the threshold T1 (S440). Thereafter, when the process corresponding to the command ends (S450: Yes), the memory controller 220 transmits status information representing normal completion and an interrupt signal to the host 100 (S460).

In this way, according to the first embodiment, the host 100 checks a response form the storage 200 by using the polling system after transmitting a command to the storage 200. In a case where a time is required for a process corresponding to the received command, the storage 200 notifies switching of the responding method to the interrupt system to the host 100. When this notification is received, the host 100 stops polling and checks a response by using the interrupt system. In a case where a time is required for the process, the storage 200 transmits a response representing a normal end and an interrupt signal to the host 100. The host 100 checks the response representing the normal end based on the reception of the interrupt signal. By performing such a process, according to the first embodiment, a decrease in the use efficiency of calculation resources in the host can be prevented.

Second Embodiment

In a second embodiment, the storage 200 includes two nonvolatile memories having mutually-different operation speeds or response times. In the second embodiment, at the time of accessing the high-speed NVM, a response to polling is checked, and, at the time of accessing the low-speed NVM, a response to an interrupt is checked. The high-speed NVM has an operation speed higher than the low-speed NVM. Alternatively, the high-speed NVM has a response time shorter than the low-speed NVM.

Figure 7:
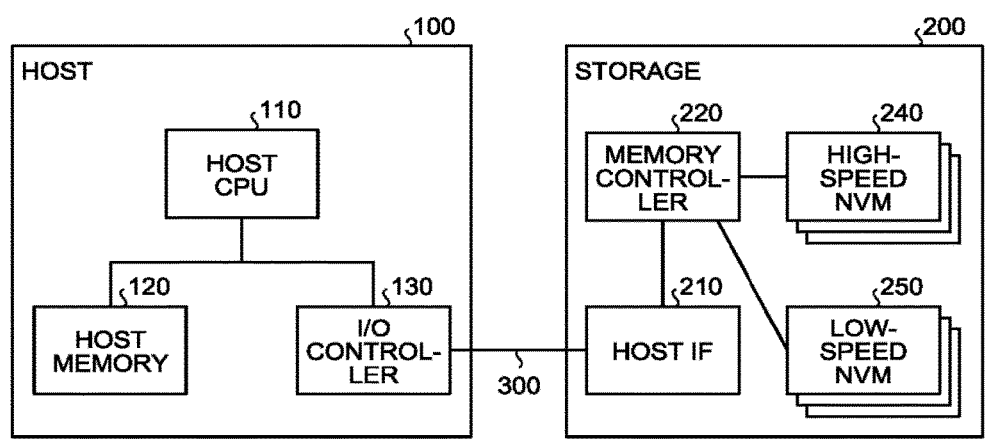
FIG. 7 is a functional block diagram that illustrates an example of the configuration of an information processing device according to a second embodiment.

FIG. 7 is a block diagram that illustrates an example of the configuration of an information processing device 1 according to the second embodiment. The configuration of the host 100 is similar to that according to the first embodiment. The storage 200 includes nonvolatile memories including a high-speed NVM 240 and a low-speed NVM 250 having an operation speed lower than the high-speed NVM 240. The configurations of a host IF 210 and a memory controller 220 are similar to those according to the first embodiment. The memory controller 220 has an internal configuration illustrated in FIG. 2. In the high-speed NVM 240, data (hot data) having a high access frequency is stored, and, in the low-speed NVM 250, data (warm data or cold data) having an access frequency lower than that of the data stored in the high-speed NVM 240 is stored. The high-speed NVM 240, for example, is a storage class memory (SCM). The low-speed NVM 250, for example, is a NAND flash memory.

Figure 8:
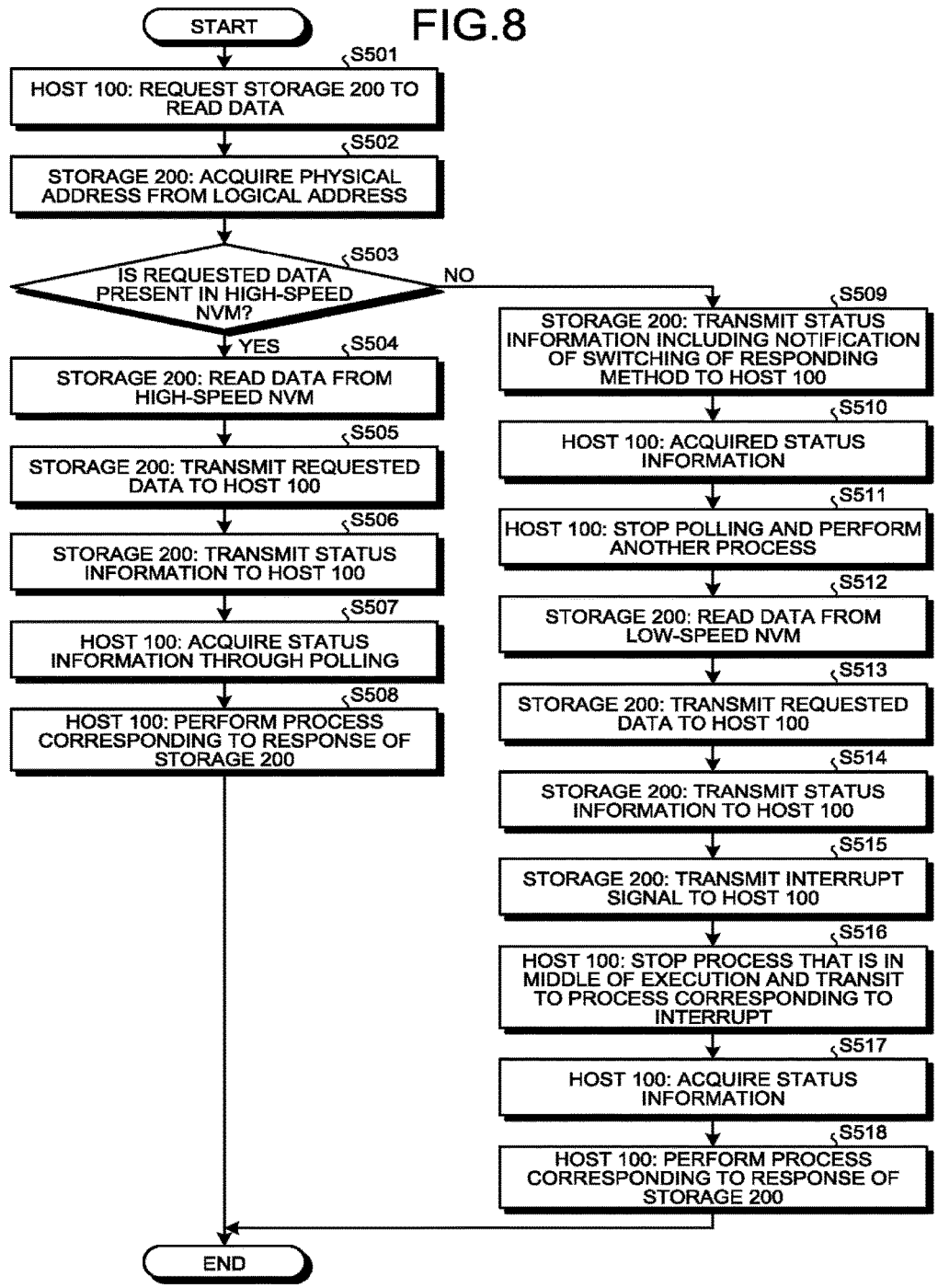
FIG. 8 is a flowchart that illustrates an example of the operation sequence of the information processing device according to the second embodiment.

Hereinafter, the second embodiment will be described in detail. FIG. 8 is a flowchart that illustrates an outline of the operations of the host 100 and the storage 200 performed when the host 100 requests the storage 200 to perform data read. First, the host 100 issues a read request to the storage 200 (S501). After the issuance of this read request, the host 100 checks whether or not a completion response has been notified from the storage 200 through polling.

The storage 200 translates a logical address included in the read request received from the host 100 into a physical address (S502). The storage 200 determines one of the high-speed NVM 240 and the low-speed NVM 250 in which requested read data is stored based on this translation (S503). In a case where the data is present in the high-speed NVM 240 (S503: Yes), the storage 200 reads data corresponding to the designated logical address from the high-speed NVM 240 (S504). The storage 200 performs an error correction for the data read from the high-speed NVM 240 and transmits the error-corrected data to the host 100 (S505). When the transmission of the data is completed, the storage 200 generates status information representing normal completion or an error and transmits the generated status information to the host 100 (S506). The host 100 acquires the status information through polling and analyzes the content thereof (S507). The host 100 performs a process corresponding to a response of the storage 200 and ends a series of sequences (S508).

On the other hand, in a case where the data is not present in the high-speed NVM 240 but stored in the low-speed NVM 250 (S503: No), the storage 200 generates status information including a notification of switching of a responding method and transmits the generated status information to the host 100 (S509). The host 100 acquires this status information through polling and analyzes the content thereof (S510). Then, the host 100 stops polling and performs another process in accordance with the internal state (S511).

The storage 200 reads data corresponding to the designated logical address from the low-speed NVM 250 (S512). The storage 200 performs an error correction for the data read from the low-speed NVM 250 and transmits the error-corrected data to the host 100 (S513). In a case where the error correction fails, the data is not transmitted to the host 100. When transmission of the data is completed, the storage 200 generates status information representing normal completion or an error and transmits the generated status information to the host 100 (S514). In addition, the storage 200 transmits an interrupt signal to the host 100 (S515). When the interrupt signal is received, the host 100 stops the process that is in the middle of execution and performs an interrupt handler process corresponding to the interrupt signal (S516). The host 100 acquires the status information, which represents normal completion or an error, transmitted from the storage 200 by the interrupt handler process and analyzes the content (S517). Thereafter, the host 100 performs a process corresponding to a response of the storage 200 (S518).

Figure 9:
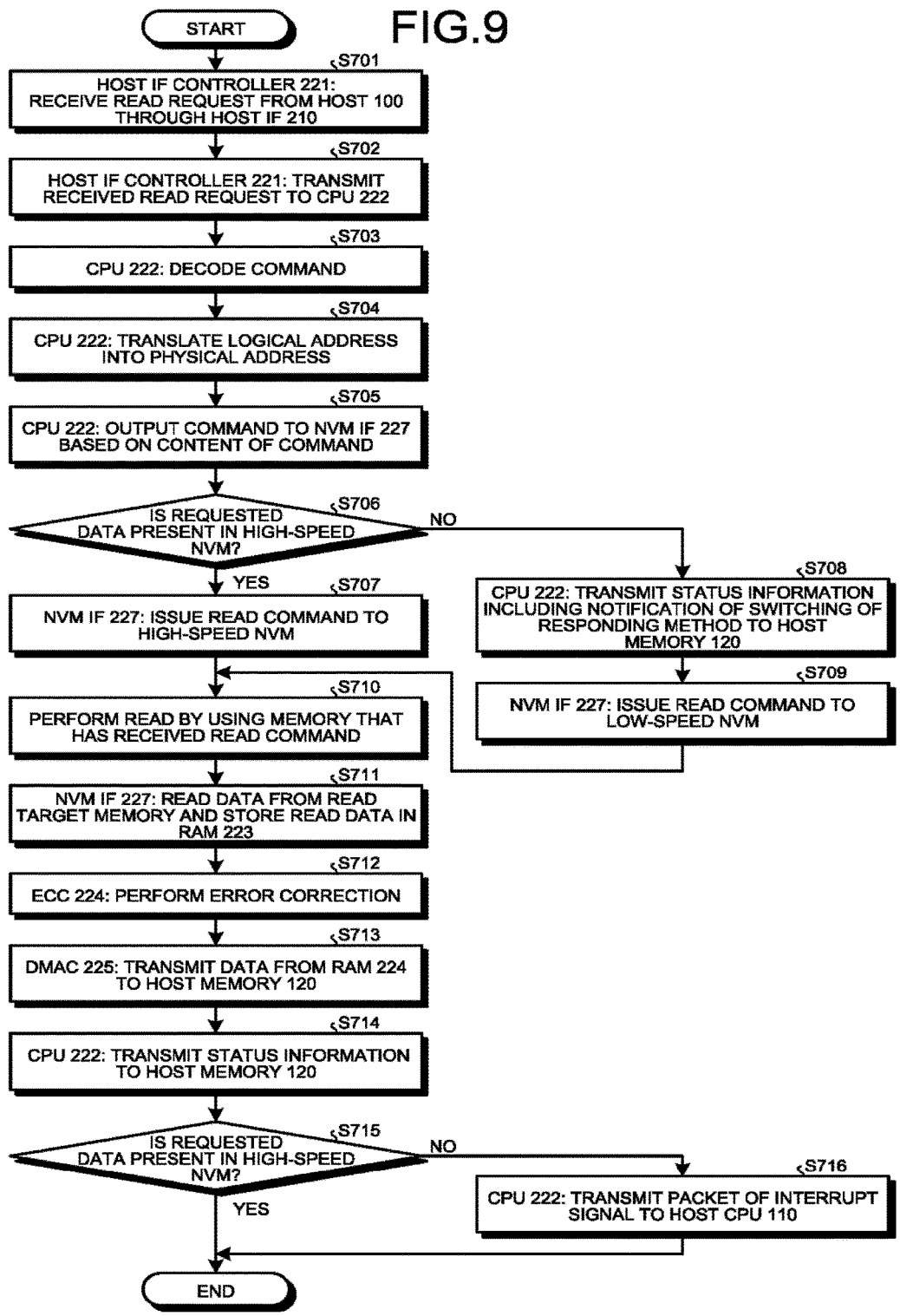
FIG. 9 is a flowchart that illustrates an example of the operation sequence of a storage device according to the second embodiment.

Next, the read process described above will be described in detail. The detailed process of the host 100 is the same as that illustrated above with reference to FIG. 4, and duplicate description will not be presented. FIG. 9 is a flowchart that illustrates a detailed operation of the storage 200 (the memory controller 220). The operation of the storage 200 will be described with reference to FIG. 9.

The host IF controller 221 receives a read request including a read command, a logical address, and a data length from the host 100 through the host IF 210 (S701). The host IF controller 221 transmits the received read request to the CPU 222 (S702). The CPU 222 decodes the transmitted read command (S703).

Next, the CPU 222 translates the logical address designated by the read command into a physical address (S704). The CPU 222 outputs a read command corresponding to the read command and the physical address to the NVM IF 227 (S705). The CPU 222 and the NVM IF 227 determines one of the high-speed NVM 240 and the low-speed NVM 250 in which the requested data is stored based on the translated physical address (S706). In a case where the requested data is stored in the high-speed NVM 240 (S706: Yes), the NVM IF 227 converts the input read command into a command that can be interpreted by the high-speed NVM 240 and outputs the converted command to the high-speed NVM 240 (S707).

On the other hand, in a case where the requested data is stored in the low-speed NVM 250 (S706: No), the CPU 222 generates status information including a notification of switching of a responding method and transmits the generated status information to the host 100 (S708). In addition, the NVM IF 227 converts the input read command into a command that can be interpreted by the low-speed NVM 250 and outputs the converted command to the low-speed NVM 250 (S709).

A read target memory that is one of the high-speed NVM 240 and the low-speed NVM 250 performs a read process based on the received command (S710). When the read process is completed, the memory that has performed the read process notifies the completion of the read process to the NVM IF 227. When the notification of the completion of the read process is received, the NVM IF 227 takes out data from the read target memory and stores the taken-out data in the RAM 223 (S711).

Next, the ECC unit 224 reads data from the RAM 223 and performs an error correction for the read data (S712). The ECC unit 224 stores the error-corrected data in the RAM 223 again. The DMAC 225 reads data from the RAM 223 and transmits the read data to the host memory 120 through the host IF controller 221, the host IF 100, the I/O bus 300, and the I/O controller 130 (S713). In a case where the error correction fails, the data is not transmitted to the host 100. When the transmission of the data to the host 100 is completed, the DMAC 225 notifies the completion of the transmission of the data to the CPU 222. When this notification is received, the CPU 222 generates status information representing normal completion or an error and transmits the generated status information to the host memory 120 through the host IF controller 221 (S714). In addition, the CPU 222 determines one of the high-speed NVM 240 and the low-speed NVM 250 in which the read data transmitted to the host 100 is stored (S715). In a case where the read data is stored in the high-speed NVM 240 (S715: Yes), the CPU 222 ends the process without performing any other operation. In this case, the host CPU 110 acquires status information from the host memory 120 through polling. On the other hand, in a case where the read data is stored in the low-speed NVM 250 (S715: No), the CPU 222 transmits a packet of an interrupt signal to the host CPU 110 through the host IF controller 221 (S716). In this case, the host CPU 110 starts up an interrupt handler in response to the interrupt signal and acquires status information from the host memory 120.

In the description presented above, while the read process has been described as an example, the second embodiment can be also applied to the case of a write process.

In this way, according to the second embodiment, the host 100 checks a response form the storage 200 by using the polling system after transmitting a command to the storage 200. In a case where a process corresponding to the received command is performed by the low-speed NVM, the storage 200 notifies switching of the responding method to the interrupt system to the host 100. When this notification is received, the host 100 stops polling and checks a response by using the interrupt system. On the other hand, in a case where the storage 200 accesses the low-speed NVM, the storage 200 transmits a completion response and an interrupt signal to the host 100. The host 100 checks the completion response based on the reception of the interrupt signal. By performing such a process, according to the second embodiment, a decrease in the use efficiency of calculation resources in the host can be prevented.

Third Embodiment

According to a third embodiment, similar to the second embodiment, a storage 200 includes nonvolatile memories including a high-speed NVM 240 and a low-speed NVM 250. In the third embodiment, both a host 100 and the storage 200 autonomously determine a method of checking a completion response. Accordingly, both the host 100 and the storage 200 include information representing a correspondence relation between a logical address designated by the host 100 and physical addresses of the high-speed NVM 240 and the low-speed NVM 250 disposed in the storage 200.

Figure 10:
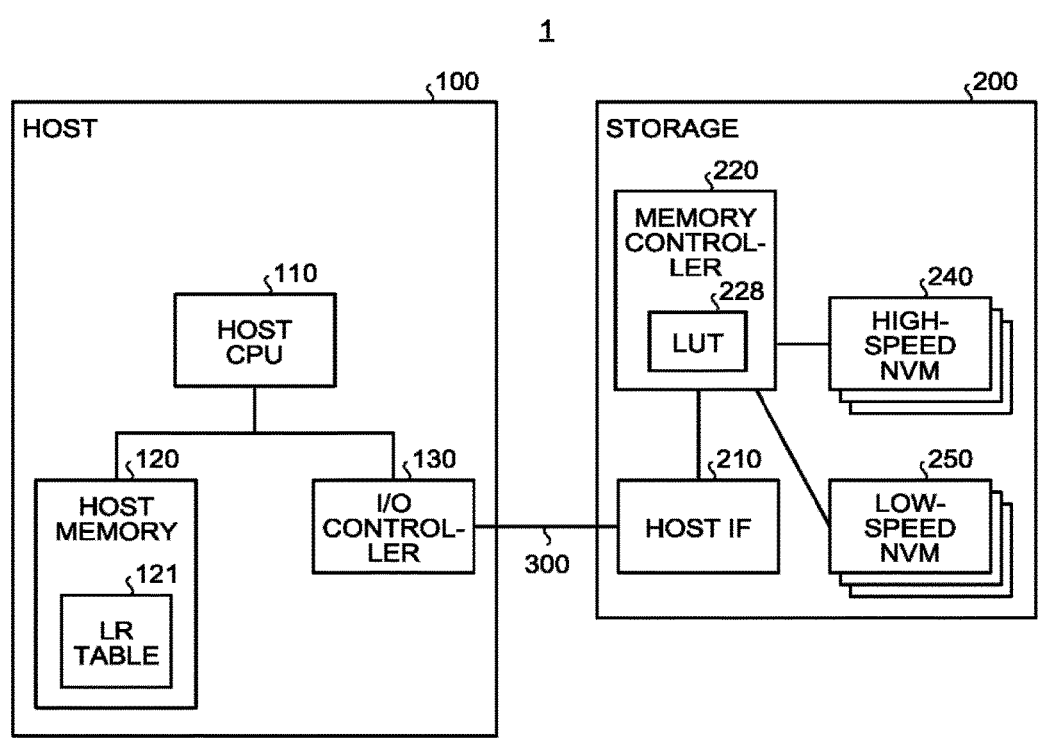
FIG. 10 is a functional block diagram that illustrates an example of the configuration of an information processing device according to a third embodiment.

FIG. 10 is a block diagram that illustrates an example of the configuration of an information processing device 1 according to the third embodiment. The storage 200 includes nonvolatile memories including a high-speed NVM 240 and a low-speed NVM 250. In the high-speed NVM 240, the hot data described above is stored, and, in the low-speed NVM 250, the warm data or the cold data described above is stored. A memory controller 220 includes a look-up table (LUT) 228. The LUT 228 is a table that is used for the logical/physical translation described above, and the storage 200 autonomously determines a method of checking a response based on the table. The host 100 includes a logical region (LR) table 121 inside the memory controller 220. The LR table 121 stores a correspondence relation between a logical region including a plurality of logical addresses and information representing whether data belonging to each logical region is stored in the high-speed NVM 240 or the low-speed NVM 250. By searching the LR table based on a logical address, it can be determined whether data is stored in the high-speed NVM 240 or the low-speed NVM 250.

Matching between data stored in the LUT 228 and data stored in the LR table 121 is performed. For example, when the initialization process of the information processing device 1 performed at the time of power-on, matching between the LUT 228 and the LR table 121 is performed. In addition, after the initialization process, regularly or at the time of performing a write process for the storage 200, matching between the LUT 228 and the LR table 121 is performed.

Figure 11:
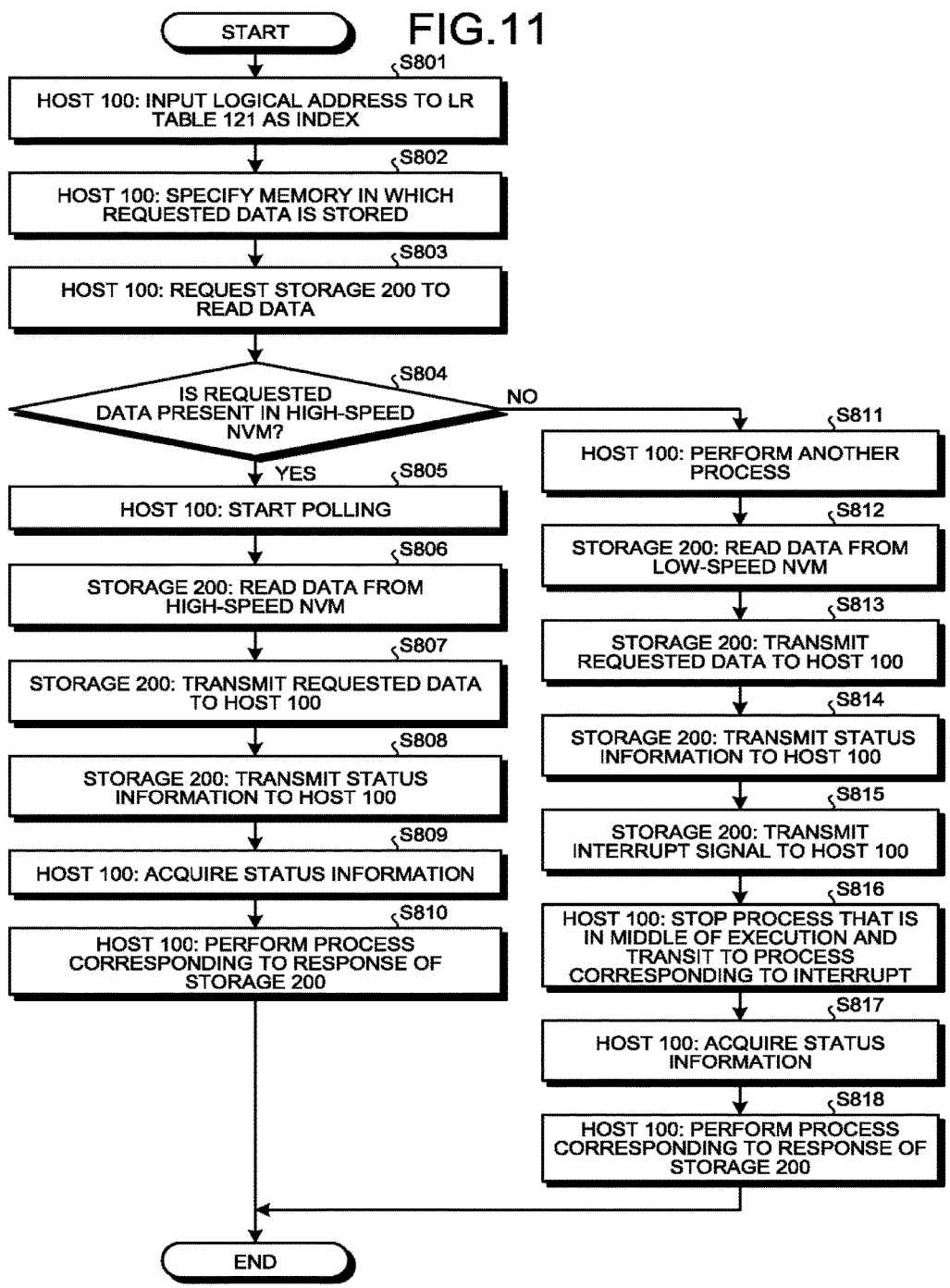
FIG. 11 is a flowchart that illustrates an example of the operation sequence of the information processing device according to the third embodiment.

Hereinafter, the third embodiment will be described in detail. FIG. 11 is a flowchart that illustrates an outline of the operations of the host 100 and the storage 200 performed when the host 100 requests the storage 200 to perform data read. First, the host 100 inputs a logical address to be accessed to the LR table 121 as an index (S801) and specifies one of the high-speed NVM 240 and the low-speed NVM 250 in which data requested to be read is stored (S802). Next, the host 100 issues a read request to the storage 200 (S803). In a case where the data requested to be read is stored in the high-speed NVM 240 (S804: Yes), the host 100 starts polling and checks whether or not a completion response is notified from the storage 200 through polling (S805). Meanwhile, the storage 200 that has received the read request translates a logical address included in the read request into a physical address by using the LUT 228 and determines one of the high-speed NVM 240 and the low-speed NVM 250 in which the requested read data is stored (S804).

In a case where the data is present in the high-speed NVM 240, the storage 200 reads data corresponding to the designated logical address from the high-speed NVM 240 (S806). The storage 200 performs an error correction for the data read from the high-speed NVM 240 and transmits the error-corrected data to the host 100 (S807). When the transmission of the data is completed, the storage 200 generates status information representing normal completion or an error and transmits the generated status information to the host 100 (S808). The host 100 acquires the status information through polling and analyzes the content thereof (S809). The host 100 performs a process corresponding to a response of the storage 200 and ends a series of sequences (S810).

On the other hand, in a case where the data is not present in the high-speed NVM 240 but stored in the low-speed NVM 250 (S804: No), the host 100 performs a different process based on the internal state (S811). In a case where the data is present in the low-speed NVM 250, the storage 200 reads the data corresponding to the designated logical address from the low-speed NVM 250 (S812). The storage 200 performs an error correction for the data read from the low-speed NVM 250 and transmits the error-corrected data to the host 100 (S813). When the transmission of the data is completed, the storage 200 generates status information representing normal completion or an error and transmits the generated status information to the host 100 (S814). In addition, the storage 200 transmits an interrupt signal to the host 100 (S815). When the interrupt signal is received, the host 100 stops the process that is in the middle of execution and performs an interrupt handler process corresponding to the interrupt signal (S816). The host 100 acquires the status information representing normal completion or an error transmitted from the storage 200 through the interrupt handler process and analyzes the content (S817). Thereafter, the host 100 performs a process corresponding to a response of the storage 200 (S818).

Figure 12:
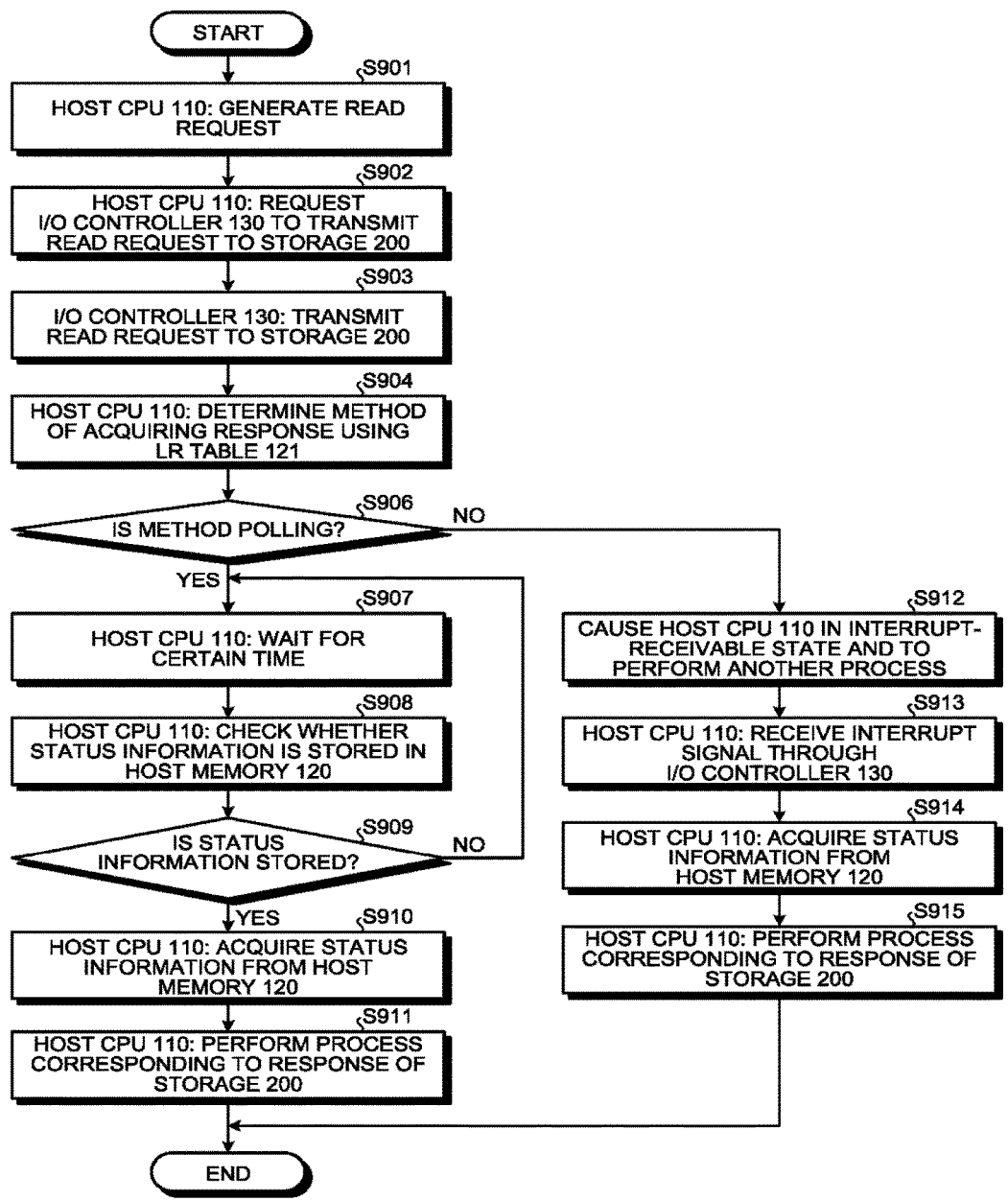
FIG. 12 is a flowchart that illustrates an example of the operation sequence of a host device according to the third embodiment.
Figure 13:
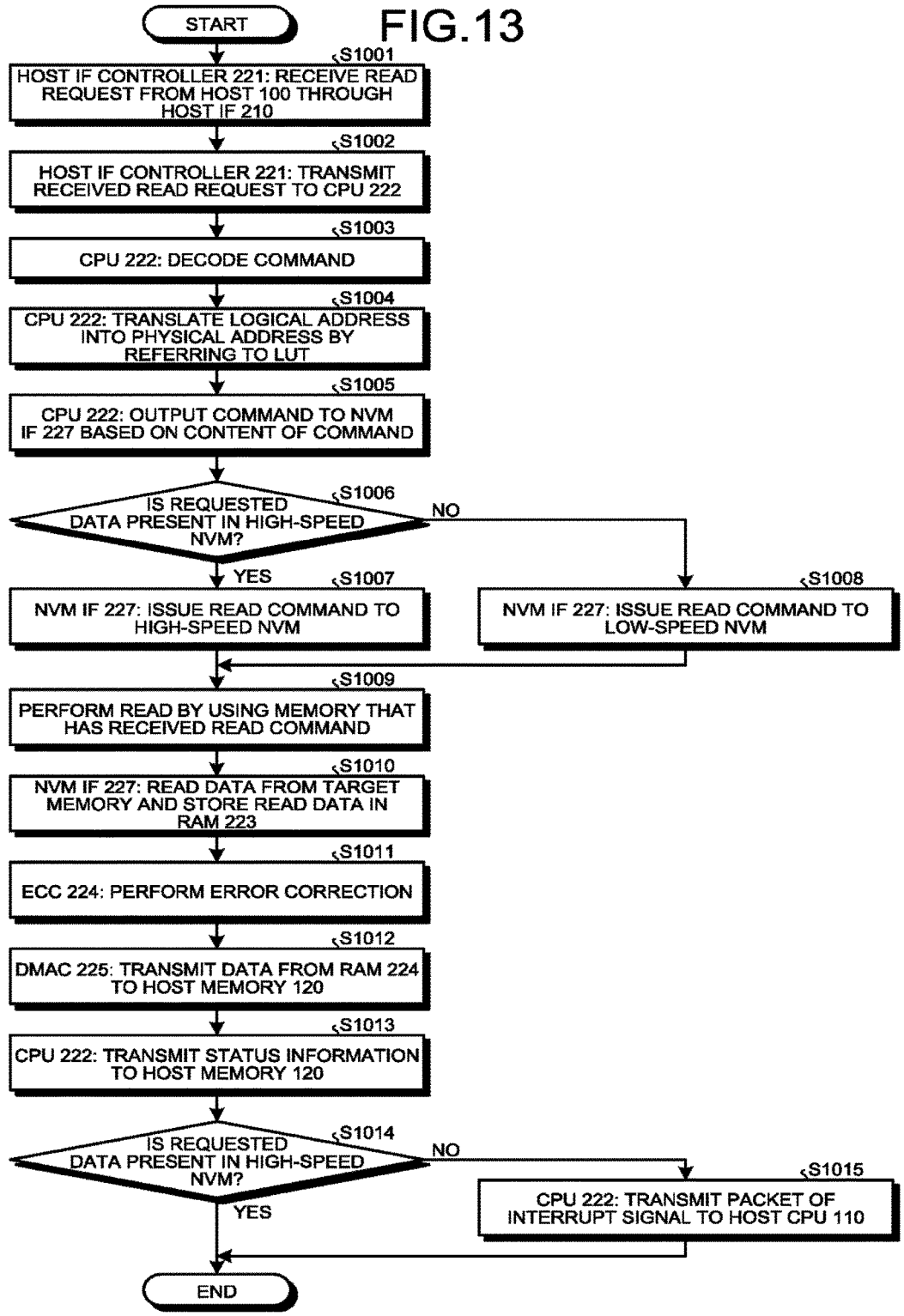
FIG. 13 is a flowchart that illustrates an example of the operation sequence of a storage device according to the third embodiment.

Next, the read process described above will be described in detail. FIG. 12 is a flowchart that illustrates a detailed operation of the host 100. FIG. 13 is a flowchart that illustrates a detailed operation of the storage 200 (the memory controller 220).

First, the detailed operation of the host 100 will be described with reference to FIG. 12. The host CPU 110 generates a read request including a read command issued to the storage 200, a logical address, and a data length (S901). The host CPU 110 performs control of the I/O controller 130 such that the generated read request is transmitted to the storage 200 (S902). The I/O controller 130 transmits the read request to the storage 200 through the I/O bus 300 (S903). The host CPU 110 inputs a logical address included in the read request to the LR table 121 as an index (S801), specifies one of the high-speed NVM 240 and the low-speed NVM 250 in which the data requested to be read is stored, and determines a method of checking the completion response from the storage 200 based on the specifying (S904).

In a case where the checking method is polling (S906: Yes), the host CPU 110 waits for a certain time that is determined in advance (S907). When the certain time described above elapses, the host CPU 110 checks whether or not status information is stored in the host memory 120 (S908). In a case where the status information is not stored in the host memory 120 (S909: No), the host CPU 110 performs a polling process of repeating the process of S907 to S909 until the reception of the status information is checked. In a case where the status information is stored in the host memory 120 (S909: Yes), the host CPU 110 acquires the status information from the host memory 120 and checks the content of the acquired status information (S910). The host 100 performs a process corresponding to a response of the storage 200 and ends a series of sequences (S911).

On the other hand, in a case where the checking method is not polling but an interrupt (S906: No), the host CPU 110 is in an interrupt receiving state and performs a different process based on the internal state until an interrupt signal of the storage 200 is received (S912). Thereafter, the host CPU 110 receives the interrupt signal through the I/O controller 130 (S913). When the interrupt signal is received, the host CPU 110 starts up an interrupt handler, acquires the status information from the host memory 120, and checks the content of the acquired status information (S914). The host 100 performs a process corresponding to a response of the storage 200 and ends a series of sequences (S915).

Next, the detailed operation of the storage 200 will be described with reference to FIG. 13. The host IF controller 221 receives a read request including a read command, a logical address, and a data length from the host 100 through the host IF 210 (S1001). The host IF controller 221 transmits the received read request to the CPU 222 (S1002). The CPU 222 decodes the transmitted read command (S1003).

Next, the CPU 222 translates the logical address designated by the read command into a physical address by referring to the LUT 228 (S1004). The CPU 222 outputs a read command corresponding to the read command and the physical address described above to the NVM IF 227 (S1005). The CPU 222 determines one of the high-speed NVM 240 and the low-speed NVM 250 in which the requested read data is stored based on a result of the logical/physical translation using the LUT 228 (S1006).

In a case where the requested data is stored in the high-speed NVM 240 (S1006: Yes), the NVM IF 227 converts the input read command into a command that can be interpreted by the high-speed NVM 240 and outputs the converted command to the high-speed NVM 240 (S1007). In a case where the requested data is stored in the low-speed NVM 250 (S1006: No), the NVM IF 227 converts the input read command to a command that can be interpreted by the low-speed NVM 250 and outputs the converted command to the low-speed NVM 250 (S1008).

The read target memory that is one of the high-speed NVM 240 and the low-speed NVM 250 performs a read process based on the read command (S1009). When the read process is completed, the memory that has performed the read process notifies read completion to the NVM IF 227. When the notification of the read completion is received, the NVM IF 227 takes out data from the read target memory and stores the taken-out data in the RAM 223 (S1010).

Next, the ECC unit 224 reads data from the RAM 223 and performs an error correction for the read data (S1011). The ECC unit 224 stores the error-corrected data in the RAM 223 again. The DMAC 225 reads data from the RAM 223 and transmits the read data to the host memory 120 through the host IF controller 221, the host IF 100, the I/O bus 300, and the I/O controller 130 (S1012). In a case where the error correction fails, the data is not transmitted to the host 100. When the transmission of the data to the host 100 is completed, the DMAC 225 notifies the completion of the transmission of the data to the CPU 222. When this notification is received, the CPU 222 generates status information representing normal completion or an error and transmits the generated status information to the host memory 120 through the host IF controller 221 (S1013). In addition, the CPU 222 determines one of the high-speed NVM 240 and the low-speed NVM 250 in which the read data transmitted to the host 100 is stored (S1014). In a case where the read data is stored in the high-speed NVM 240 (S1014: Yes), the CPU 222 ends the process without performing any other operation. In this case, the host CPU 110 acquires status information from the host memory 120 through polling. On the other hand, in a case where the read data is stored in the low-speed NVM 250 (S1014: No), the CPU 222 transmits a packet of an interrupt signal to the host CPU 110 through the host IF controller 221 (S1015). In this case, the host CPU 110 starts up an interrupt handler in response to the interrupt signal and acquires status information from the host memory 120.

In the description presented above, while the read process has been described as an example, the third embodiment can be also applied to the case of a write process.

In this way, according to the third embodiment, in a case where the storage 200 includes the high-speed NVM 240 and the low-speed NVM 250, both the host 100 and the storage 200 perform autonomous determinations, whereby a response from the storage 200 is checked by selecting one of the polling and the interrupt. For this reason, the host 100 does not need to wait for a notification of information from the storage 200, and a decrease in the use efficiency of calculation resources in the host can be prevented without causing any delay.

In addition, the second or third embodiment can be applied to a storage acquired by combining three or more types of memory chips. For example, a storage that is configured by a DRAM, a NAND flash memory, and a storage class memory (SCM) having an intermediate operation speed therebetween is assumed. In this storage, in a case where the DRAM and the SCM in which hot data is stored is accessed, the polling system is selected, and, in a case where the NAND flash memory is accessed, the interrupt system is selected.

Fourth Embodiment

In a fourth embodiment, first, the interrupt system is used, and then the method of checking a completion notification is switched from the interrupt system to the polling system in response to a request from the storage. In a case where a long time is not required for the process, the storage transmits a request for switching the method of checking a completion response to the host.

Figure 14:
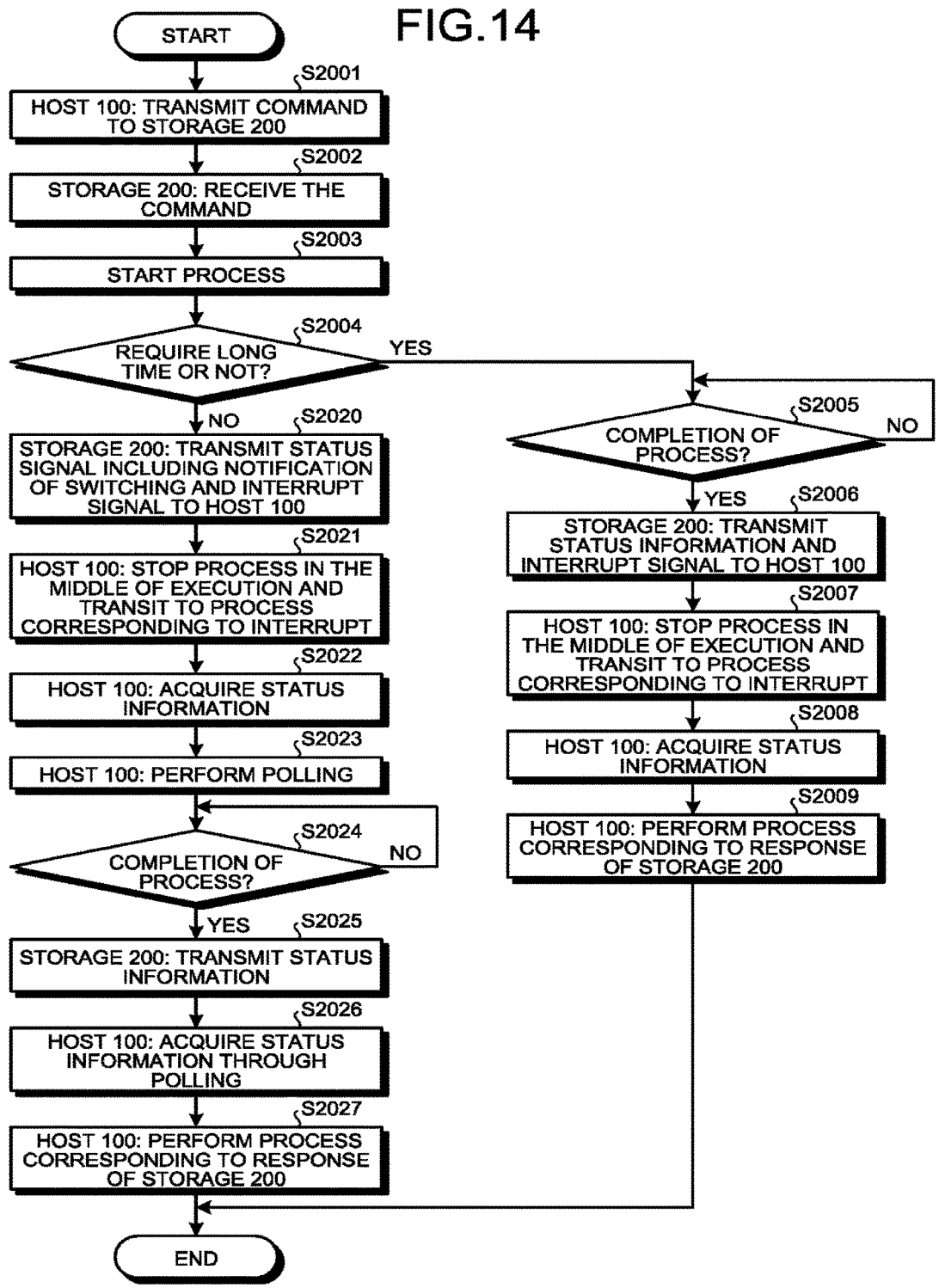
FIG. 14 is a flowchart that illustrates an example of the operation sequence of the information processing device according to the fourth embodiment.

FIG. 14 is a flowchart that illustrates operation examples of a host 100 and a storage 200 in the fourth embodiment. Each of configurations illustrated in FIGS. 1, 7, and 10 can be applied to a configuration of an information processing device. First, the host 100 transmits a command to the storage 200 (S2001). For example, this command is the read request or the write request. After this command is transmitted, a host CPU 110 of the host 100 is in an interrupt receiving state, and performs another process in accordance with an internal state until receiving an interrupt signal of the storage 200. The storage 200 receives the command from the host 100 (S2002). The storage 200 starts a process corresponding to the received command (S2003).

The storage 200 determines whether or not a long time is required for this process of the command (S2004). As this determination method, any method of the following (a) to (d) described above and the like can be employed.

(a) Determining whether or not an error correction process has failed (whether or not a data restoration process is performed)

(b) Determining whether or not a write process for the first area has been successful (c) Determining whether or not a count value T of process time has exceeded the threshold T1

(d) Determining whether access is performed to a high-speed NVM or a low-speed NVM When the storage 200 determines that a long time is required for this process of the command (S2004: Yes), the storage 200 continues this process of the command. When this process of the command ends (S2005: Yes), the storage 200 transmits status information representing normal completion and an interrupt signal to the host 100 (S2006). When receiving the interrupt signal, the host 100 stops the process that is in the middle of execution and performs an interrupt handler process corresponding to the interrupt (S2007). The host 100 performs status check to determine a status signal received from the storage 200 by the interrupt handler process, and acquires status information representing normal completion transferred from the storage 200 (S2008). Thereafter, the host 100 performs a process corresponding to the completion response of the storage 200 (S2009).

When determining that a long time is not required for this process of the command (S2004: No), the storage 200 transmits status information including a notification of switching to notify switching of a responding method to the host 100 and the interrupt signal to the host 100 (S2020). When receiving the interrupt signal, the host 100 stops the process that is in the middle of execution and performs an interrupt handler process corresponding to the interrupt (S2021). The host 100 performs the status check through the interrupt handler process, and acquires status information including the notification of switching received from the storage 200 (S2022). Then, the host 100 starts polling (S2023).

On the other hand, when the process of the command ends (S2024: Yes), the storage 200 transmits status information representing normal completion to the host 100 (S2025). The host 100 acquires the status information representing normal completion through polling (S2026). The host 100 performs a process corresponding to the completion response of the storage 200 (S2027).

In the flowchart in FIG. 14, when determining that a long time is not required for the process of the command (S2004: No), the storage 200 transmits the status information including a notification of switching and the interrupt signal to the host 100 in step S2020. However, in step S2020, it may be possible for the storage 200 to transmit only the interrupt signal to the host 100 and not to transmit the status information including a notification of switching to the host 100. In this method, when receiving the interrupt signal, the host CPU 110 starts up an interrupt handler and performs status check. In this status check, when the status information is not stored in a host memory 120, the host CPU 110 performs a control so as to start polling.

For example, the fourth embodiment is useful for the following information processing device. The storage 200 is a storage on which both a high-speed NVM and a low-speed NVM are mounted. The low-speed NVM has a larger capacity than the high-speed NVM. There is a high possibility that data is stored in the low-speed NVM, and therefore the interrupt system is used first. When determining that data is stored in the high-speed NVM, the storage 200 transmits the notification of switching to the host 100, and switches the method of checking a response to polling.

In the fourth embodiment, the interrupt system is used first, and the method is switched to the polling system when a long time is not required for the process in the storage. Therefore, a decrease in the use efficiency of calculation resources in the host can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information processing device comprising:
a storage device that includes a nonvolatile memory; and
a host device that is coupled with the storage device,
the host device including a first controller configured to
transmit a first command to the storage device,
perform polling,
stop the polling in a case where a first response is received from the storage device, and
receive a second response based on reception of an interrupt signal from the storage device, and
the storage device including a second controller configured to
start a first process corresponding to the first command in a case where the first command is received from the host,
transmit the first response to the host in a case where a first condition relating to an execution time of the first process is satisfied, and
transmit the second response and the interrupt signal to the host in a case where the first condition is satisfied and the first process is completed.

2. The information processing device according to claim 1, wherein,
in a case where the first condition is not satisfied and the first process is completed, the second controller transmits a third response to the host, and
the first controller receives the third response based on the polling.

3. The information processing device according to claim 1, wherein the first condition is satisfied when the execution time of the first process is larger than a first threshold.

4. The information processing device according to claim 1, wherein
the first command is a read request,
when an error correction process for data read from the nonvolatile memory fails and the data for which the error correction process fails is determined to be recovered, the first condition is satisfied, and
when the error correction process is successful, the first condition is not satisfied.

5. The information processing device according to claim 4, wherein the error correction process is a process based on a Bose Chaudhuri Hocquenghem code.

6. The information processing device according to claim 5, wherein the error correction process is a process based on a product code or a low-density parity-check code.

7. The information processing device according to claim 5, wherein the error correction process includes a process of calculating a read voltage for re-reading and re-reading data using the calculated re-read voltage.

8. The information processing device according to claim 1, wherein
the first command is a write request,
when data writing to a first area of the nonvolatile memory fails and data writing to a second area is to be performed, the first condition is satisfied, and
when data writing to the first area of the nonvolatile memory is successful, the first condition is not satisfied.

9. The information processing device according to claim 1, wherein the nonvolatile memory includes a first memory and a second memory having an operation speed lower than the first memory,
when the first process is performed by accessing the second memory, the first condition is satisfied, and
when the first process is performed by accessing the first memory, the first condition is not satisfied.

10. The information processing device according to claim 9, wherein the second controller stores, into the first memory, data having an access frequency higher than data stored in the second memory.

11. The information processing device according to claim 9, wherein the first memory is a storage class memory, and the second memory is a NAND type flash memory.

\* \* \* \* \*